United States Patent
Park et al.

(10) Patent No.: US 6,894,925 B1
(45) Date of Patent: May 17, 2005

(54) FLASH MEMORY CELL PROGRAMMING METHOD AND SYSTEM

(75) Inventors: Sheunghee Park, Santa Clara, CA (US); Sameer S. Haddad, San Jose, CA (US); Chi Chang, Redwood City, CA (US); Richard M. Fastow, Cupertino, CA (US); Ming Sang Kwan, San Leandro, CA (US); Zhigang Wang, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 10/342,585

(22) Filed: Jan. 14, 2003

(51) Int. Cl.[7] .............................................. G11C 16/04
(52) U.S. Cl. ............................ 365/185.01; 365/185.18; 365/185.27
(58) Field of Search ....................... 365/185.01, 185.18, 365/185.27

(56) References Cited

U.S. PATENT DOCUMENTS 6,490,205 B1 * 12/2002 Wang et al. ............ 365/185.29

2003/0185055 A1 * 10/2003 Yeh et al. .............. 365/185.28

* cited by examiner

Primary Examiner—Van Thu Nguyen
Assistant Examiner—Pho M. Luu

(57) ABSTRACT

A flash memory cell programming system and method that facilitate efficient and quick operation of a flash memory cell by providing a biasable well (e.g., substrate) is presented. The biasable well flash memory cell enables increases in electrical field strengths in a manner that eases resistance to charge penetration of a dielectric barrier (e.g., oxide) around a charge trapping region (e.g., a floating gate). The present biasable well system and method also create a self convergence point that increase control during programming operations and reduces the chances of excessive correction for over erased memory cells. The biasing can assist hard programming to store information and/or soft programming to correct the effects of over-erasing. The biasing can also reduce stress on a drain voltage pump, reduce leakage current and reduce programming durations. Some implementations also include a biasable control gate component, biasable source component and biasable drain component.

20 Claims, 7 Drawing Sheets

600

610

Increasing the electric field strength in the channel of a memory cell.

620

Altering a charge level in a charge trapping region.

FIG. 6

FLASH MEMORY CELL PROGRAMMING METHOD AND SYSTEM

TECHNICAL FIELD

The present claimed invention relates to the field of memory programming. More particularly the present invention is associated with a soft programming method for short channel NOR flash cells.

BACKGROUND ART

Electronic systems and circuits have made a significant contribution towards the advancement of modem society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Frequently, these advantageous results are realized through the use of information stored on a memory media and manipulated by a processing device. The type of memory storage medium can have significant impacts on the performance of an information processing system.

Numerous electronic devices include processors that operate by executing software comprising a series of instructions for manipulating data in the performance of useful tasks. The instructions and associated data are typically stored in a memory. Memories usually consist of a location for storing information and a unique indicator or address. The utility a device provides often depends upon the speed and efficiency at which instructions are executed. The ability to access a memory and transfer information quickly and conveniently usually has a significant impact on information processing latency. The configuration of a memory usually affects the speed at which memory locations are accessed.

Certain types of memories built upon flash memory technologies usually offer the potential for relatively fast information access. Flash memories typically include flash memory cells arranged in a matrix in which each cell is characterized by a voltage operating range. A charge level in a floating gate of the flash memory cell controls whether or not a flash memory cell turns "on" or "off" when a threshold voltage level within the operating range is applied to a gate of the flash memory cell.

Flash memory arrays usually offer a number of desirable characteristics. Flash memories are usually nonvolatile and can retain information even if power is turned off. Flash memory cells are able to store a charge in the floating gate even though system power is turned off and thereby maintain an indication of whether a logical 1 or logical 0 value is "stored" in the cell. Flash memories typically allow random access to data and in-system programmability similar to dynamic random access memory (DRAM). Flash memories are typically solid state and able to withstand shock vibrations and environmental conditions better than electromechanical devices such as a hard drive.

While flash memories offer a variety of potential advantageous characteristics, utilizing traditional flash memories often gives rise to some potential problems. While flash memories may have relatively fast read operations, they traditionally also have relatively long programming times. It often takes in the order of milliseconds to reach the desired level of charge in a floating gate. In addition, flash memories are typically susceptible to over erasing in which an excessive charge condition is established in the floating gate. A corrective programming operation is typically used to correct over-erasing. The relationship between the threshold voltage and the charge correction operation is basically exponential making it difficult to control. During traditional charge correction operations to correct over erasing conditions the threshold voltage levels keep rising as the corrective programming time increases. The continued increase in threshold voltage level often causes an over programming issue. Traditional attempts at correcting over-erasing are often difficult to implement and add significant additional time to programming operations. In addition, traditional attempts at achieving greater flash cell concentration by using short channels with high drain induced barrier loading (DIBL) often cause many problems during corrective programming such as high leakage current. Additional resulting strains on voltage pumps often reduce drain voltage levels and further increasing corrective programming difficulties and reduction of cells that can be serviced by the voltage pump.

An efficient flash memory system and method is desirable.

SUMMARY OF THE INVENTION

The present invention is a flash memory programming system and method that facilitate efficient and quick operation of a flash memory cell by providing a biasable well (e.g., substrate). In one embodiment, a present invention flash memory cell programming system and method include a biasable well (e.g., substrate) that enables increases in electrical field strengths which assist charge alteration in a floating gate of the flash memory cell. The electric fields provide additional force that aids the charge movement though a dielectric barrier (e.g., oxide) around a charge trapping region (e.g., a floating gate). The assistance from the electric field enables faster programming of the flash memory cell. The present biasable well system and method also create a self convergence point that increase control during programming operations and reduces the chances of excessive correction for over erased memory cells. The biasing can also facilitate reduction of stress on a drain voltage pump, reduction of leakage current, and reduction of programming durations. Some implementations also include a biasable gate, biasable source and biasable drain in a flash memory cell.

BRIEF DESCRIPTION OF THE DRAWINGS

FIG. 6 is a flow chart of a programming method of the present invention.

DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The present invention is a flash memory biasing system and method that facilitates efficient and quick operation of a flash memory cell. In one embodiment, a present invention biasable flash memory cell enables increases in electrical field strengths in a manner that eases resistance to charge penetration of a dielectric barrier (e.g., oxide) around a charge trapping region (e.g., a floating gate). The biasing can assist hard programming to store information and/or soft programming to correct the effects of over-erasing. The biasing may also facilitate reduction of stress on a drain voltage pump, reduction of leakage current and reduction of programming durations. One embodiment of the present invention includes a biasable substrate. Some implementations also include a biasable gate, biasable source and biasable drain in a flash memory cell.

Figure 1:
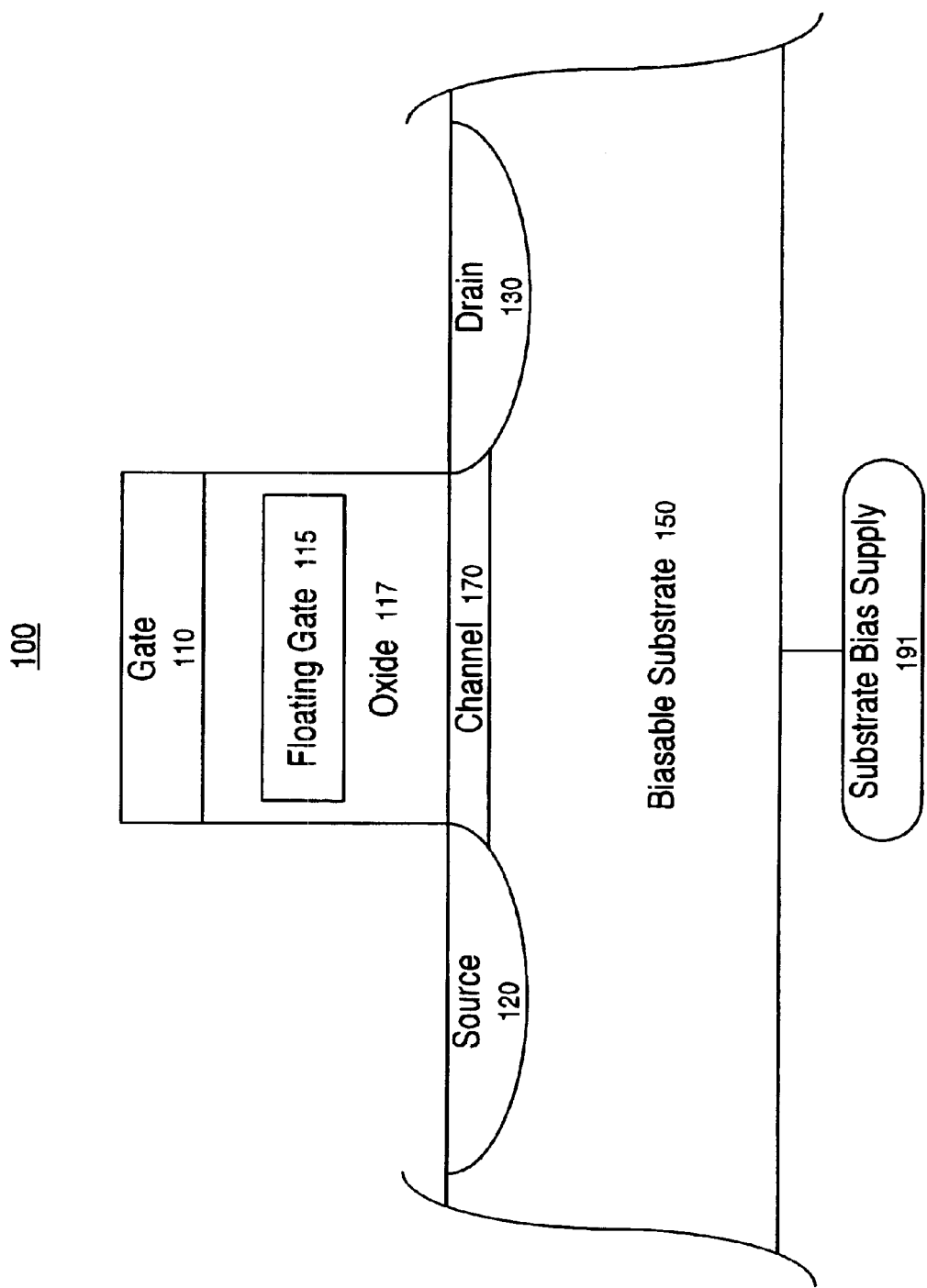
FIG. 1 is a block diagram illustration of a flash memory cell in accordance with one embodiment of the present invention.

FIG. 1 is a block diagram illustration of a flash memory cell 100 in accordance with one embodiment of the present invention. Flash memory cell 100 includes control gate 110, charge trapping region 115 (e.g., a floating gate), semi-permeable insulation region 117 (e.g., an oxide region), source 120, drain 130, biasable well region 150 (e.g., a substrate) and current conducting channel 170. Control gate 110 is coupled to semi-permeable region 117 which is coupled to floating charge trapping region 115 and biasable well region 150. Biasable well region 150 is coupled to source 120 and drain 130. For ease of use and convention, charge trapping region 115 and semi-permeable insulating region 117 are referred to as a floating gate and an oxide region respectively, but are not necessarily limited to these implementations.

The components of flash memory cell 100 cooperatively operate to store information. Current conducting channel 170 has doped characteristics of a first charge nature (e.g., positive or negative) and enables current flow depending upon charge levels in control gate 110 and floating gate 115. Biasable well region 150 supplies bulk charges when biased that increases the electric field strength of current conducting channel 170 and thereby facilitates charge penetration of oxide region 117 and conduction of current in current conducting channel 170. Source 120 includes charge doping characteristics opposite of the first charge nature and supplies current to current conducting channel 170. Drain 130 has charge doping characteristics also opposite of the first charge nature and drains current from current conducting channel 170. Oxide region 117 has insulating characteristics that also act as an barrier to charges entering or leaving floating gate 115 depending upon memory cell voltage levels (e.g., voltage level differential applied to control gate 110 and drain 130). Control gate 110 has a capacity to receive a voltage and collect charge levels that control current flow in current conducting channel 170. Floating gate 115 "traps" or "stores" charges which can impact the "control" (e.g., shift the threshold voltage) of control gate 110 and thereby store information.

The biasable substrate 150 facilitates conveyance of charges (e.g., "hot' electrons) to and from floating gate 150 when biased by increasing the electrical field strength (e.g., lateral and/or vertical) of current conducting channel 170. Increasing the electrical field strength effectively reduces the barrier resistance of oxide region 117 to charge penetration, which facilitates the transition of electrons to and from floating gate 115. Thus, it is easier for charges to overcome the insulation barrier (e.g., semi-permeable barrier 117) of the charge trapping region (e.g., floating gate 115) and thus more charges are able to move to and from the floating gate at any given instant. The stronger electric field also facilitates current conduction in current conducting channel 170 permitting reduction of the drain 130 voltage requirements for several different flash memory cell 100 operations (e.g., programming, erasing, soft programming, etc.).

In one embodiment of the present invention, information is stored in flash memory cell 100. Flash memory cell 100 utilizes two states (e.g., a written state and an erased state) to store information. The charge level of the floating gate determines the flash memory cell state by shifting the threshold voltage. An erased state occurs when a first charge level in the floating gate does not significantly impact (e.g., no appreciable shift in the threshold voltage) the memory cell's turn-on/off threshold voltage. A written state occurs when a second charge level does significantly impact the memory cell's turn-on/off threshold voltage (e.g., there is an appreciable shift in threshold voltage). The present invention is readily adaptable for storing multi-bit information in a flash memory cell. For example, by shifting the threshold voltage in multi-level stages. Various programming operations alter the charge level of the floating gate. An erase operation includes the application of an erasing voltage differential (e.g., a voltage that forces charges out of the floating gate or vise versa) between control gate 110 and drain 130 or source 120. A write operation includes the application of a writing voltage differential between control gate 110 and drain 130 or source 120 (e.g., a voltage that forces charges into the floating gate).

The information stored in flash memory cell 100 is capable of being read. A read operation includes the application of a read voltage differential applied between control gate 110 and current conducting channel 170. Whether or not a read voltage satisfies (e.g., exceeds) the threshold voltage requirements depends upon the charge level in the floating gate. In one embodiment of the present invention, a read voltage differential is sufficient to satisfy threshold voltage requirements (e.g., to turn "on" the memory cell) after an erase operation occurs but not after a write operation. For example, in one embodiment of an NMOS flash memory cell in a write state, the floating gate has sufficient negative charge to prevent a positive read voltage applied to the control gate during a read operation from controlling a current flow in the current conducting channel 170. However, in an erase state, the floating gate charge does not prevent a positive read voltage applied to the control gate during a read operation from controlling a current flow in the current conducting channel 170.

Flash memory cell 100 stores information by establishing a charge level (e.g., "write" or "erase" charge level) in the floating gate 115 corresponding to a logical value and sensing the impact on the flow of current in current conducting channel 170 during a read operation. In one exemplary implementation, the status of current flow between the source 120 and the drain 130 in a read condition is utilized to establish storage of a logical 1 value or a logical 0 value. For example, a logical 1 can be assigned to an indication of a current flow between source 120 and drain 130 and a logical 0 can be assigned to an indication of no current flow between source 120 and drain 130, or vise versa. Since the charge level state in the floating gate 115 can impact the current flow in current conduction channel 117, there is a correlation between a logical 1 value or a logical 0 value and the charge in floating gate 115. In one embodiment of the present invention, multiple bits of information are stored by establishing a multiple charge level (e.g. "write" or "erase" charge level) in the floating gate 115 corresponding to multiple logical values stores and sensing the impact on the flow of current in current conducting channel 170 during a read operation.

In one embodiment, the charge level of floating gate 115 is altered by passing "hot" electrons to and from floating gate 115 across the semi-permeable barrier 117 (e.g., oxide). The "hot" electrons flow into floating gate 115 when a programming voltage is applied between control gate 110 and drain 130 or source 120. The "hot" electrons flow out of floating gate 115 when an erase voltage is applied between control gate 110 and drain 130. When biasable substrate 150 is biased electric fields are produced that assist "hot" electrons pass relatively easily into and out of floating gate 115 providing strong programming characteristics.

In one embodiment of the present invention, soft programming is utilized to correct for an excessive erase charge state in the floating gate that may occur after an erase operation. The excessive erase charge can alter the flash memory cell characteristics and interfere with operations by causing undesirable leakage current and/or threshold voltage level problems. In one exemplary implementation, soft programming includes restoring a default charge level to the floating gate (e.g., by applying a pulse signal to the source or drain). The default charge level minimizes leakage current problems and enables the current flow status in current conducting channel 170 to change based upon desirable threshold voltage ranges applied to the control gate.

Figure 2:
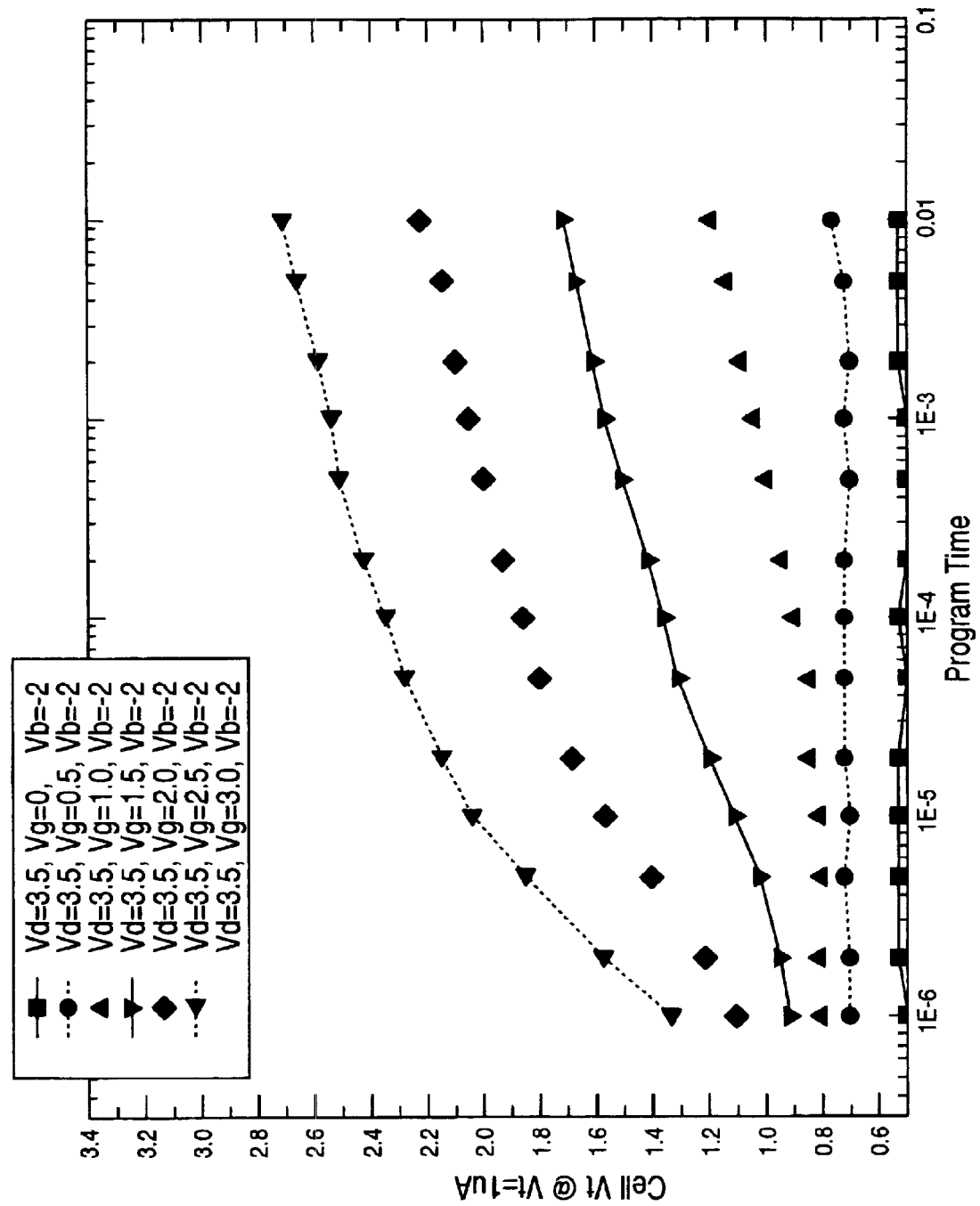
FIG. 2 illustrates an exemplary relationship between a present invention threshold voltage and the soft program time with a biased substrate.

Appropriately biasing biasable well 150 increases electrical field strengths within the memory cell and thereby enables fast and controllable soft programming of floating gate 115 by making charge migration to and from the floating gate easier. For example, a soft programming process utilizing pulses is able to convey more charges with each pulse. Since more charges are able to be conveyed with each pulse it takes less pulses to convey the desired amount of charge to reach a default charge state and thereby facilitates reduction of the soft programming time. FIG. 2 illustrates an exemplary relationship between the threshold voltage and the soft program time with a biased substrate. For example, the soft programming timing is about $5\mu$ to approximately 1 m seconds for soft programming up to 1.2 threshold volts and less than less than 2.0 threshold volts with a soft programming control gate voltage set at about 3.5 volts, the drain voltage set at about 3.5 volts and the well bias voltage set at about negative 2 volts. It can also convey an exemplary soft programming time versus programming time (e.g., with a negative substrate bias).

The graph of FIG. 2 also indicates that a biased substrate also enables additional desirable control traits at appropriate voltage levels (e.g., Vd=3.5, Vg=2.5, Vb=−2). The method uses a self-convergence point during soft programming that diminishes over correction or to much charge alteration in the floating gate during soft programming. When the substrate bias is increased the cell reaches saturation as shown in the graph and overshooting is substantially minimized while the electric field due to the well bias is increased. At the appropriate voltage levels the curve has two basic regions or slope characteristics. In the first region very fast soft programming for a particular voltage threshold range can be achieved and in the second region threshold voltage change (e.g., floating gate charge changes) is less sensitive to soft programming time. In one exemplary implementation, the second region is utilized during soft programming to minimize excessive charge alteration in the floating gate. The added control due to self governing is also very beneficial in multi-bit storage applications. In one exemplary implementation, the control gate voltage can be used to control the final program threshold voltage and the biased well assists minimize the chances of significant overshooting.

Figure 3:
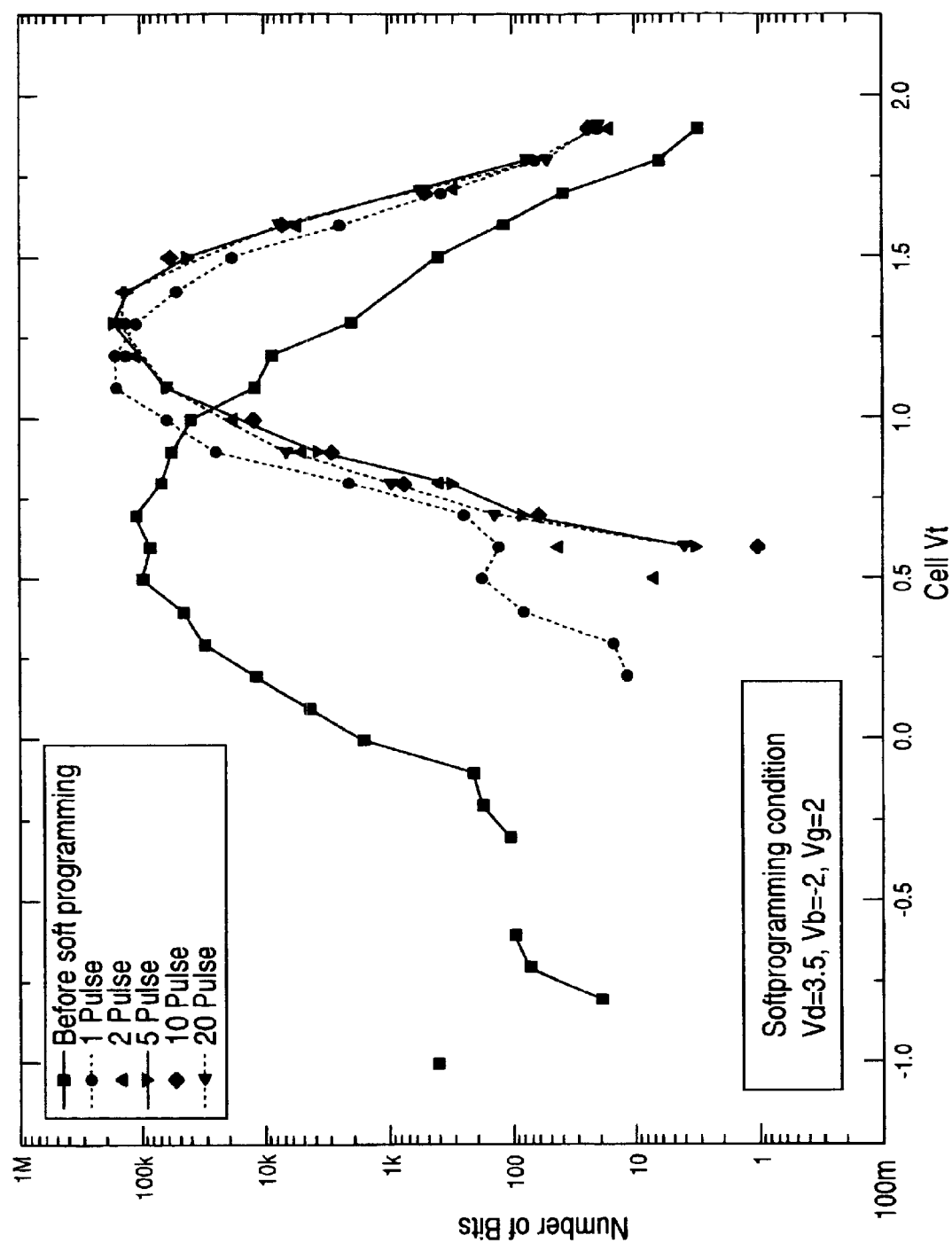
FIG. 3 shows over-erasing can be corrected by soft programming with a biased substrate in one embodiment of the present invention by bringing the threshold voltage distribution for a plurality of erased memory cells back into a tight range.

FIG. 3 shows over-erasing before soft programming may occur in one embodiment, but bringing the threshold voltage distribution for a plurality of erased memory cells is brought back into a tight range is facilitated by an exemplary implementation of the present invention biased substrate. In the present example, the main distribution becomes very tight and does not move very much for a biased well uni-level programming flash after just one pulse push back. The initial potential over-erasing of a memory cell may produce a very high initial leakage current level (e.g., over 1 micro) that otherwise may create programming troubles. However, after just one soft programming pulse with a biased substrate in the present example there is a big drop or reduction in leakage current. After five soft programming pulses (e.g., 1 pulse=$1\mu$ sec.) the cells in the present example have a threshold voltage over 0.6 volts and the maximum erase threshold voltage has not changed. One embodiment of the present invention achieves even tighter threshold voltage distribution over a plurality of memory cells by fine tuning the pulse timing and/or memory cell biasing (e.g., by adjusting the well bias and/or providing a source bias to improve results).

Figure 4:
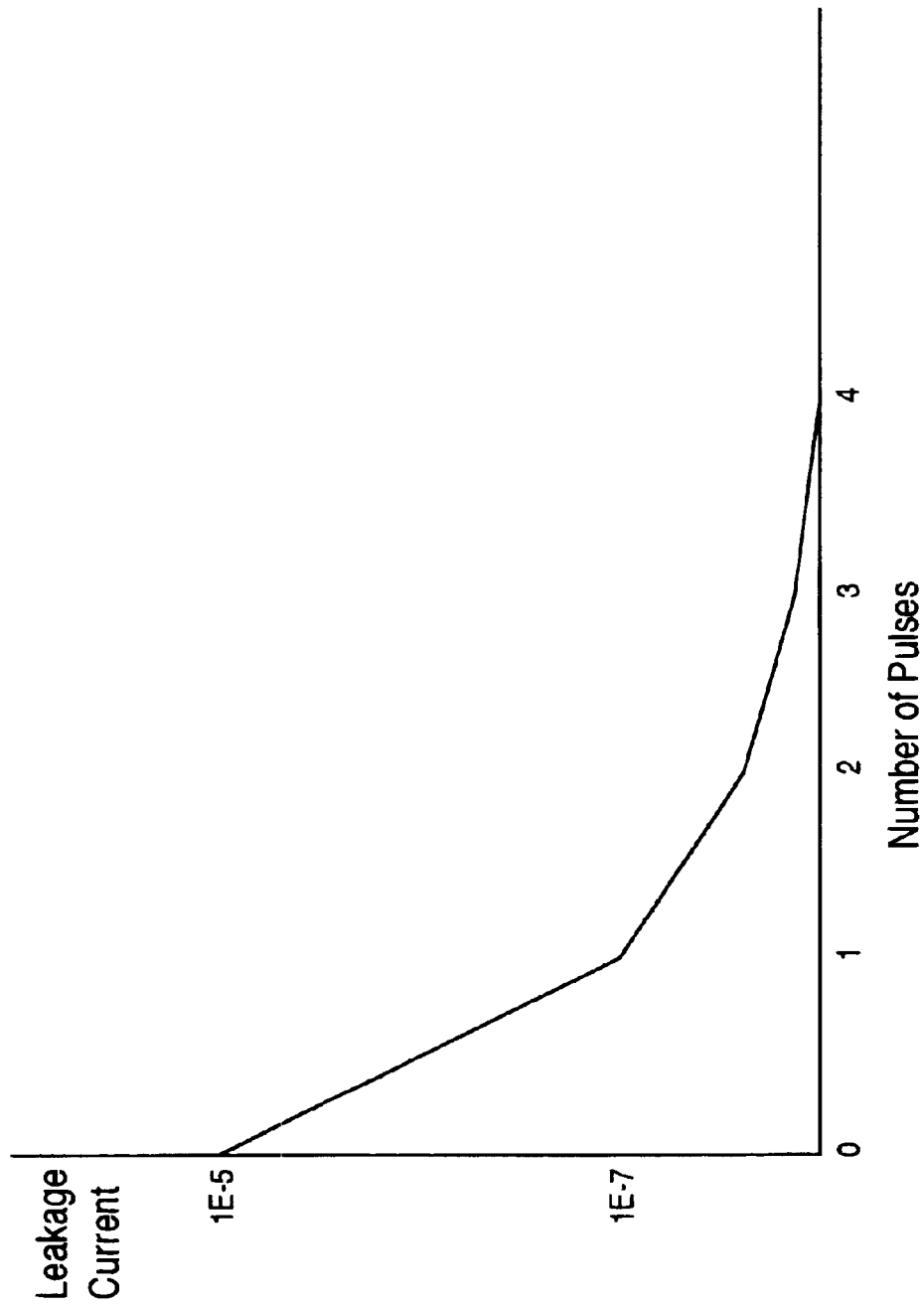
FIG. 4 illustrates that bit line leakage current rapidly decreases with each soft programming pulse in one embodiment of the present invention.

FIG. 4 illustrates that in one embodiment of the present invention bit line leakage current rapidly decreases with each soft programming pulse. The biased substrate facilitates bit line leakage reduction and shorter channel devices with higher drain induced barrier level (DIBL) can be used without adding strain on the drain voltage supply. Biasing the substrate also reduces the leakage current (e.g., due to high DIBL of a short channel) further minimizing strain on the drain supply.

In one embodiment of the present invention, the increased electrical field due to biasing the substrate also reduces the strain on the drain voltage pump in a number of operations. In read operations the resistance to current flowing between the drain and source is reduced which in turn facilitates reduction of cell demands on the drain voltage supply. The biasable substrate facilitates generation of hard carriers thereby permitting a programming voltage (e.g., applied to the drain) in the present invention to be lower than a conventional programming voltage level. Reducing the programming voltage enables more cells to be programmed by the same programming voltage supply pump.

Figure 5:
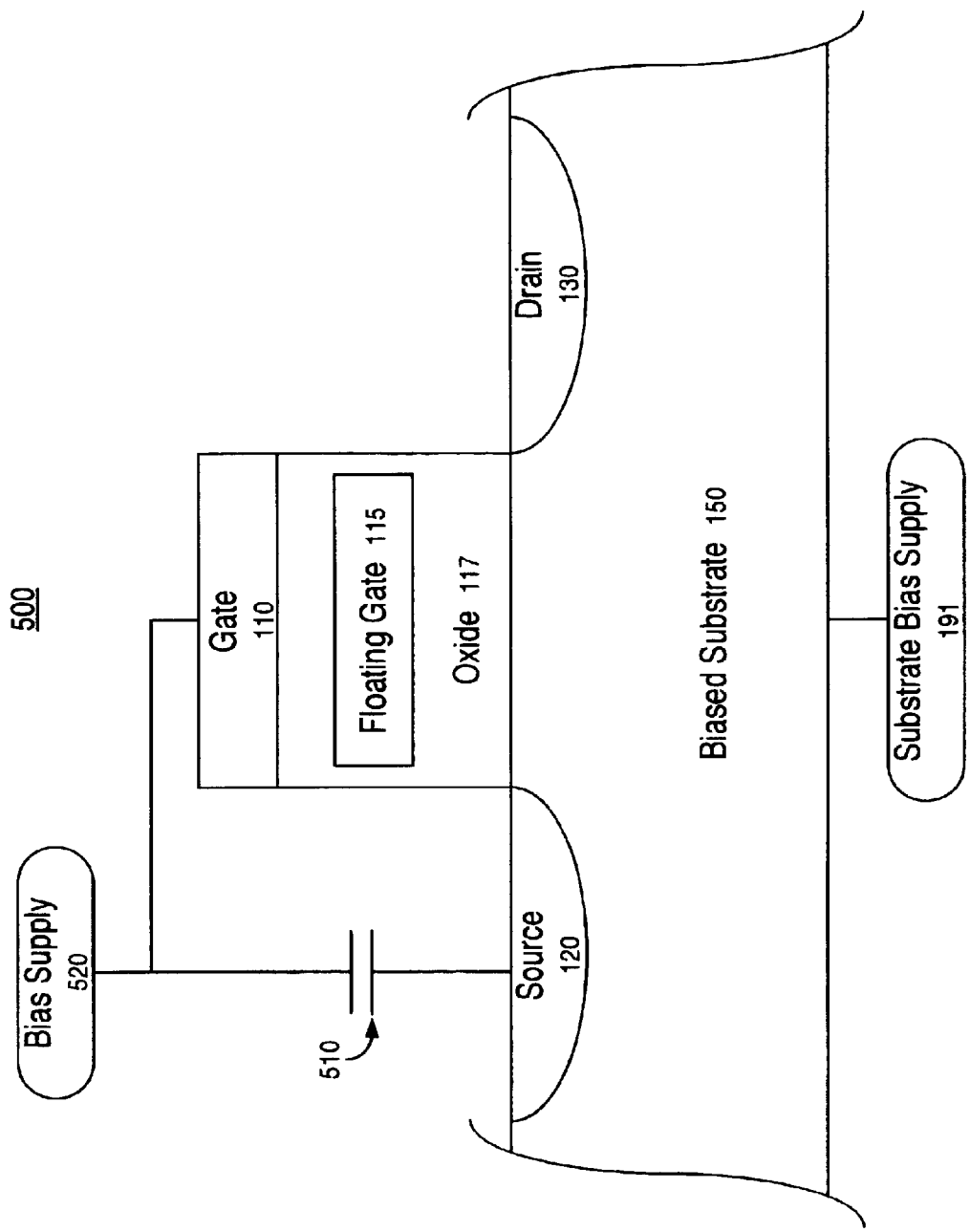
FIG. 5 is another illustration of a present invention flash cell configuration.

FIG. 5 is another illustration of a present invention flash cell configuration. A well bias supply 191 is coupled to biasable substrate 150 to increase the electromotive potential between the well and drain. The source 120 and control gate 110 are also biased by bias source 520. In one exemplary implementation the drain voltage Vd is used for soft programming. There is a capacitor 510 coupled to the source 120. In one exemplary implementation, after an over erase condition occurs the floating gate has a "negative 0.5 volt" charge (e.g., a charge that effectively reduces the threshold voltage by 0.5 volts) in a "normally on" cell with a "normal" threshold voltage of 1 volt. Without correcting the over-erase condition (e.g., soft programming) the floating gate charge means that the current conducting channel only experiences an effective field strength of 0.5 volts when 1 volt is applied to the control gate. Thus, the current conducting channel does not turn on since the effective voltage at the channel is only 0.5 volts. However, when the well bias of 2 volts is applied to the well the electric field strength of the channel is increased permitting the current to flow at a threshold voltage of 0.5 and also automatically reduces the leakage current providing efficient soft programming.

In one exemplary implementation, the bias conditions are set within predetermined parameters. For example, the drain bias condition (e.g., Vd) is over 2.5 volts and less than 5 volts. The selection of the upper boundary on the drain bias depends upon the breakdown voltage for the device. For example, the 5 volt upper limit is a little bit behind or less than the breakdown voltage or if breakdown is 10 volts then the upper boundary on the drain bias is chosen to be 10 or less volts (e.g., 9 volts). In one exemplary implementation, the generation of hard carriers begins at 3 volts. The source bias (e.g., Vs) is between 0 volts and 2 volts. The selection of the upper boundary of the source bias is based upon the generation of a hard carrier. For example, since 3 volts starts to generate hard carriers in the present example, then 2 volts is chosen because the 5 volts of the drain voltage minus the substrate bias of 2 volts results in 3 volts hard carriers start being generated. The well bias (Vb) is in a range of negative 0.5 to above negative 2 volts. The lower boundary (e.g., negative 0.5) is a point cutting off the back bias effect and cutting off the leakage current. Then upper boundary (Vb) is kept above negative 2 volts which is bottom of the junction breakdown. The gate bias can be connected to ground or to an alternate level (e.g., 4 volts) to facilitate multilevel applications.

FIG. 6 is a flow chart of a programming method 600 of the present invention. The programming method alters the charge in charge trapping region (e.g., a floating gate of a flash memory cell). In one embodiment of the present invention, programming method 600 utilizes increased electrical field strengths to facilitate or assist the alteration of charges in the charge trapping region.

In step 610 an electrical field strength of a channel in a memory cell is increased. In one embodiment of the present invention a well is biased. In one exemplary implementation, the increased electrical field is utilized to help force hot electrons into or out of a charge trapping region.

In step 620 a charge level is altered in a charge trapping region. An altered charge is insulated in charge trapping region, wherein the insulation helps retain charge in the trapping region. In one exemplary implementation a pulse signal is applied, wherein the pulse signal alters the charge in the charge trapping region. Altering the charge in the charge trapping region produces a variety of desirable results. For example the charge trapping region is returned to a desirable condition after an over erase state condition region is returned to a default condition after an over erase state condition.

Figure 7:
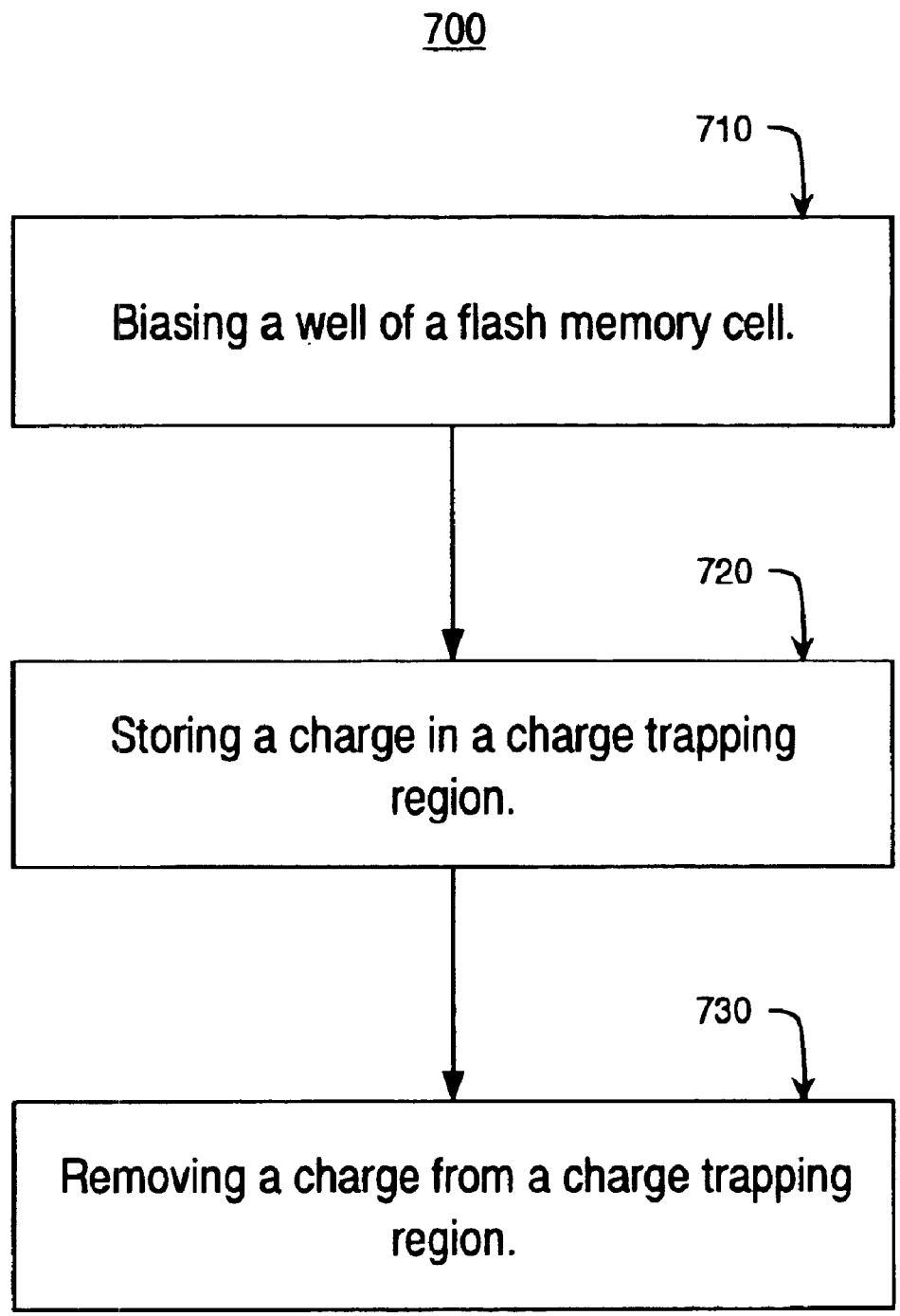
FIG. 7 is a flow chart of a flash memory method, one embodiment of the present invention.

FIG. 7 is a flow chart of flash memory method 700, one embodiment of the present invention. Flash memory method 700 facilitates flash memory cell operations, including writing, erasing, and correction of over erasing (e.g., soft programming).

In step 710 a well of a flash memory cell is biased. In one embodiment the biasing causes the flash memory cell to reach a self-convergence point. In one exemplary implementation a limit on the well biasing is determined by a junction breakdown voltage and a back bias voltage.

A charge is stored in a charge trapping region in step 720. In one embodiment charges are supplied to a floating gate and a default charge level is created in the floating gate when the self convergence point is reached. In one embodiment, the amount of charge stored in the trapping region is influenced by the well biasing. The amount of charge stored in the trapping region can also be influenced by biasing of a drain component.

At step 730 a charge is removed from the charge trapping region. In one embodiment the amount of charge removed from the trapping region is influenced by the well biasing.

In one embodiment of flash memory method 700 other components of the flash memory cell are biased. For example, a source component is biased wherein a limit on said source biasing is determined by a hard carrier generation voltage. A drain component can be biased wherein a limit on the drain biasing is determined by a junction breakdown voltage. Additionally, a control gate can be biased wherein a limit on the control gate biasing is determined by a multi-bit storage requirement.

Thus, a well biasable memory cell of the present invention facilitates floating gate charge alteration. The well biasable memory cell systems and methods utilize a self convergence point that provides greater control during floating gate charge altering operations and reduces the chances of excessive correction for over erased cells. It also permits faster correction and programming operations. The size of voltage pumps that supply drain components can be reduced and more memory cells can be supplied by a single voltage pump. The present invention well biasable memory techniques also facilitate the utilization of short channel length cells and reduces the incidence of drain leakage current in unselected bits.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory cell comprising:
   a control gate component having a capacity to receive a charge;
   an oxide region having electrical charge insulation characteristics and electrical charge penetration characteristics, said oxide region coupled to said control gate;
   a floating gate having a charge trapping region, said floating gate coupled to said oxide region;
   a biasable well component having charge doping characteristics of a first charge nature, wherein said biasable well component is configured to reduce leakage current when a bias voltage is applied to said biasable well, said biasable well coupled to said floating gate component;

a source component having charge doping characteristics opposite of said first charge nature, said source component coupled to said biasable well; and a drain component having doping charge characteristics opposite of said first charge nature, said drain component coupled to said biasable well.

2. The memory cell of claim 1 wherein said floating gate stores multi-bit information by shifting a threshold voltage in multi-level stages.

3. The memory cell of claim 1 wherein said biasable well component has characteristics that enable an electric field to be increased when a bias voltage is applied to said biasable well.

4. The memory cell of claim 1 wherein said biasable well component has characteristics that aid the movement of charge to and from said floating gate when a bias voltage is applied to said biasable well.

5. The memory cell of claim 1 wherein said source component is configured to reduce the breakdown voltage differential when a bias voltage is applied to said source component.

6. The memory cell of claim 1 wherein said gate component is configured to facilitate the programming of a threshold voltage when a bias voltage is applied to said control gate component.

7. The memory cell of claim 1 wherein said control gate component, said oxide region, said floating gate, said biasable well component, said source component and said drain component have characteristics that reach a self convergence point when a bias is applied to said biasable well.

8. A flash memory method:

biasing a well of a flash memory cell, wherein said biasing causes said flash memory cell to reach a self-convergence point;

storing a charge in a charge trapping region; wherein the amount of charge stored in said charge trapping region is influenced by said biasing of said well; and removing a charge from a charge trapping region, wherein the amount of charge removed from said charge trapping region is influenced by said biasing of said well.

9. A flash memory method of claim 8 wherein said storing a charge in said charge trapping region facilitates storage of multi-bit information.

10. A flash memory method of claim 8 further comprises:
supplying charges to a floating gate; and
creating a default charge level in said floating gate when said self convergence point is reached.

11. A flash memory method of claim 8 wherein a limit on said well biasing is determined by a junction breakdown voltage.

12. A flash memory method of claim 8 wherein a limit on said well biasing is determined by a back bias voltage.

13. A flash memory method of claim 8 further comprises biasing a source, wherein a limit on said source biasing is determined by a hard carrier generation voltage.

14. A flash memory method of claim 8 further comprising biasing a drain wherein a limit on said drain biasing is determined by a junction breakdown voltage.

15. A flash memory method of claim 8 further comprising biasing a control gate wherein a limit on said gate biasing is determined by a multi-bit storage requirement.

16. A programming method comprising:

increasing an electrical field strength in a well by biasing said well, wherein said biasing is a constant voltage over a write operation; and altering a charge in a charge trapping region, wherein altering said charge in said charge trapping region forces hot electrons into or out of a charge trapping region and said force is influenced by biasing of said well.

17. A programming method of claim 16 wherein said biasing is a constant voltage over an erase operation.

18. A programming method of claim 17 wherein said altering a charge in said charge trapping region includes applying an erasing voltage differential between a control gate and a drain or source.

19. A programming method of claim 16 wherein said altering a charge in said charge trapping region includes applying a writing voltage differential between a control gate and a drain or source.

20. A programming method of claim 16 wherein said well includes charge doping characteristics of a first charge nature that is opposite to charge doping characteristics of a source component and a drain component.

* * * * *